(12) United States Patent
Hirukawa

(10) Patent No.: US 6,265,137 B1
(45) Date of Patent: Jul. 24, 2001

(54) EXPOSURE METHOD AND DEVICE PRODUCING METHOD USING THE SAME

(75) Inventor: Shigeru Hirukawa, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/055,949

(22) Filed: Apr. 7, 1998

(30) Foreign Application Priority Data

Apr. 7, 1997 (JP) .................................................. 9-087873

(51) Int. Cl.⁷ .......................................................... G04F 7/20
(52) U.S. Cl. ........................... 430/312; 430/394; 430/396
(58) Field of Search .............................. 430/5, 313, 323, 430/394, 396, 312; 216/41

(56) References Cited

U.S. PATENT DOCUMENTS 5,811,222 * 9/1998 Gardner et al. ...................... 430/394

FOREIGN PATENT DOCUMENTS

| 4-186244 | 7/1992 | (JP) . |
| 4-273245 | 9/1992 | (JP) . |
| 4-273427 | 9/1992 | (JP) . |

OTHER PUBLICATIONS

Ueno, Atsushi, Forming Method for Pattern, Derwent of JP 1–07527, Apr. 1989.*
Okuda, Yoshimitsu, Forming Method of Photo–Resist Pattern, Derwent of JP 2–266510, Oct. 1990.*

* cited by examiner

Primary Examiner—Kathleen Duda
(74) Attorney, Agent, or Firm—Armstrong, Westerman, Hattori, McLeland, & Naughton, LLP

(57) ABSTRACT

A reticle pattern is split into a first pattern which defines a configuration in the shorter dimension (X direction) and a second pattern which defines a configuration in the longer dimension (Y direction). The length in the longer dimension of each light-blocking pattern element of the first pattern is set longer than the length in the Y direction of the original reticle pattern. The second pattern has two opening pattern elements arrayed in the Y direction at a predetermined interval. The interval is set to a distance which is not shorter than the length in the Y direction of the original reticle pattern and is shorter than the length of each light-blocking pattern element. The image of the first pattern and the image of the second pattern are superimposed on one another by overlay exposure.

26 Claims, 4 Drawing Sheets

EXPOSURE METHOD AND DEVICE PRODUCING METHOD USING THE SAME

BACKGROUND OF THE INVENTION

The present invention relates to an exposure method used for transferring a mask pattern onto a photosensitive substrate in lithography processes to produce, for example, semiconductor devices, liquid-crystal display devices, or thin-film magnetic heads. The present invention also relates to a device producing method using the exposure method.

Semiconductor devices or other similar devices are produced by using one-shot exposure type projection exposure apparatuses (e.g. steppers) in which a pattern formed on a reticle as a mask is projected onto a photoresist-coated wafer (or a glass plate or the like) through a projection optical system, or scanning exposure type projection exposure apparatuses such as the step-and-scan type. The degree of integration of semiconductor devices is becoming increasingly higher, and patterns to be formed are becoming even finer. Consequently, projection exposure apparatuses are required to provide even higher resolution.

In general, resolution is proportional to the wavelength of exposure light and inversely proportional to the numerical aperture (NA) of the projection optical system. Therefore, straightforward methods of improving the resolution are to use exposure light of shorter wavelength and to increase the numerical aperture of the projection optical system. Accordingly, excimer laser light, e.g. KrF excimer laser light (wavelength: 248 nanometers) or ArF excimer laser light (wavelength: 193 nanometers), is also used as exposure light these days. However, because depth of focus is inversely proportional to the square of the numerical aperture, the depth of focus becomes excessively shallow if the numerical aperture is merely increased. In a case where a projection optical system with a large numerical aperture is used, when defocus occurs, the pattern length varies to a considerable extent owing to the effect of wavefront aberration, although the reduction in pattern length is not remarkable at the best focus position.

To improve resolution, it has been proposed that illumination optical systems should adopt annular zone illumination which uses an annular zone-shaped aperture stop, or modified illumination which uses an aperture stop consisting essentially of a plurality of small decentered apertures. Accordingly, attempts have recently been made to combine a projection optical system having a relatively small numerical aperture and the annular zone illumination to transfer fine patterns. Even when such a technique is used, the conventional practice is to transfer one pattern by a single exposure operation.

To transfer a fine periodic pattern having a small pitch, for example, there has been proposed a technique whereby the periodic original-plate pattern is split into a plurality of separate patterns each having a pitch larger than that of the original pattern, and the images of the separate patterns are superimposed on one another by multiple exposure.

Among the conventional techniques as described above, the technique whereby a projection optical system with a small numerical aperture (NA) and the annular zone illumination are combined to transfer a fine pattern requires a large amount of light exposure because only a part of diffracted light generated from the fine pattern can pass through the projection optical system because of the small numerical aperture. In a case where the length-to-width ratio of the fine pattern is widely different from 1:1, for example, and where the pattern is sufficiently long in the longer dimension, so that the dependence of the image intensity on the numerical aperture in the longer dimension is small, if an amount of light exposure with which the width (line width) in the shorter dimension of the pattern is correctly formed is applied, over-exposure occurs in the longer dimension of the pattern. If a positive resist is used in such a case, the pattern length in the longer dimension becomes undesirably shortened.

It is difficult to correct the change in pattern length by adjusting the length in the longer dimension of the original-plate pattern used for exposure. The reason for this is as follows. The amount of correction for the change in pattern length varies according to the periodic structure in the longer dimension of the original-plate pattern. Therefore, it is necessary to determine an amount of correction by executing an extensive case sorting operation. Accordingly, it is actually difficult to correct the change in pattern length by this method.

In the conventional method in which a fine periodic pattern is split into a plurality of separate patterns, and multiple exposure is carried out for the separate patterns, no particular consideration is given to the difference in dimensional errors between the longer and shorter dimensions of the pattern.

SUMMARY OF THE INVENTION

In view of the above-described circumstances, an object of the present invention is to provide an exposure method whereby an image of a pattern whose length and width are different from each other can be transferred onto a substrate by exposure with high dimensional control accuracy.

Another object of the present invention is to provide a device producing method whereby a pattern whose length and width are different from each other can be formed on a substrate with high dimensional control accuracy by using the above-described exposure method.

The present invention provides an exposure method in which an image of a mask pattern whose length and width are different from each other is transferred onto a predetermined substrate under application of predetermined exposure light or a predetermined charged particle beam. The method includes the steps of: generating a first pattern which limits a configuration in the shorter dimension of the mask pattern, and a second pattern which limits a configuration in the longer dimension of the mask pattern; projecting an image of one of the first pattern and the second pattern onto the substrate to transfer the image thereonto; and projecting an image of the other of the first pattern and the second pattern onto the substrate over the image of the one of the first pattern and the second pattern to transfer the image of the other pattern onto the substrate.

The first and second patterns may be set such that the first pattern is wider than the mask pattern in the longer dimension of the mask pattern, and the second pattern has at least one opening pattern element disposed at an end in the longer dimension of the mask pattern. If the second pattern has at least two opening pattern elements, the distance between the respective outer sides of the opening pattern elements is not shorter than the length of the mask pattern, and the distance between the respective inner sides of the opening pattern elements is shorter than the length of the first pattern.

The substrate may be coated with a positive photosensitive material.

In addition, the present invention provides a device producing method in which a device pattern whose length and width are different from each other is formed on a predetermined substrate by using a mask having a mask pattern formed thereon. The method includes the steps of: generating a first pattern which limits a configuration in the shorter dimension of the mask pattern, and a second pattern which limits a configuration in the longer dimension of the mask pattern: coating the substrate with a photosensitive material; projecting an image of one of the first pattern and the second pattern onto the substrate under application of predetermined exposure light or a predetermined charged particle beam to transfer the image onto the substrate; projecting an image of the other of the first pattern and the second pattern onto the substrate over the image of the one of the first pattern and the second pattern under application of predetermined exposure light or a predetermined charged particle beam to transfer the image of the other pattern onto the substrate; and developing the substrate.

According to another aspect of the present invention, there is provided an exposure method in which an image of a mask pattern having a plurality of sides is transferred onto a substrate under application of predetermined exposure light or a predetermined charged particle beam. The method includes the steps of: generating a first pattern which defines a configuration of at least one side of the mask pattern, the first pattern having end portions of a desired configuration which are positioned at both ends of the at least one side; generating a second pattern which defines a configuration of one or two other sides of the mask pattern which connect with the at least one side, wherein an area which extends from a point of intersection between the side defined by the first pattern and another side defined by the second pattern to one end portion of the first pattern lies in an area which divides the second pattern in a state where the first pattern and the second pattern are matched to each other; projecting an image of one of the first pattern and the second pattern onto the substrate to transfer the image thereonto; and projecting an image of the other of the first pattern and the second pattern onto the substrate over the image of the one of the first pattern and the second pattern to transfer the image of the other pattern onto the substrate.

The side of the mask pattern which is defined by the first pattern may intersect another side defined by the second pattern at an angle not larger than 90 degrees.

According to another aspect of the present invention, there is provided an exposure method in which an image of a mask pattern including an intersection where two sides intersect each other is transferred onto a substrate under application of predetermined exposure light or a predetermined charged particle beam. The method includes the steps of: generating a first pattern which defines a configuration of one side of the mask pattern that forms the intersection, the first pattern having end portions of a desired configuration which are positioned at both ends of the one side; generating a second pattern which defines a configuration of the other side of the mask pattern that forms the intersection, wherein an area which extends from a point of intersection of the two sides to one end portion of the first pattern lies in an area which divides the second pattern in a state where the first pattern and the second pattern are matched to each other; projecting an image of one of the first pattern and the second pattern onto the substrate to transfer the image thereonto; and projecting an image of the other of the first pattern and the second pattern onto the substrate over the image of the one of the first pattern and the second pattern to transfer the image of the other pattern onto the substrate.

The side of the mask pattern which is defined by the first pattern may intersect the side of the mask pattern which is defined by the second pattern at an angle not larger than 90 degrees.

According to another aspect of the present invention, there is provided a method of forming a device pattern on a substrate. The method includes the steps of: transferring a first pattern onto the substrate, the first pattern being longer than the device pattern in regard to the longer dimension of the device pattern; exposing a part of the first pattern transferred onto the substrate to define a size in regard to the longer dimension; and developing the substrate.

In the above-described method, a second pattern may be transferred over at least a part of the first pattern transferred onto the substrate to define a size in the longer dimension.

According to another aspect of the present invention, there is provided a photomask used in an exposure apparatus. The photomask includes a first pattern longer than a device pattern to be formed on a substrate in regard to the longer dimension of the device pattern, and a second pattern formed in a second area different from a first area where the first pattern is formed. The second pattern includes a transmitting portion which is overlaid on a part of the first pattern on the substrate. The first pattern and the second pattern are each transferred onto the identical area on the substrate by the exposure apparatus.

DETAILED DESCRIPTION OF PREFERRED EMBODIMENTS

An embodiment of the present invention will be described below with reference to the accompanying drawings.

Figure 2:
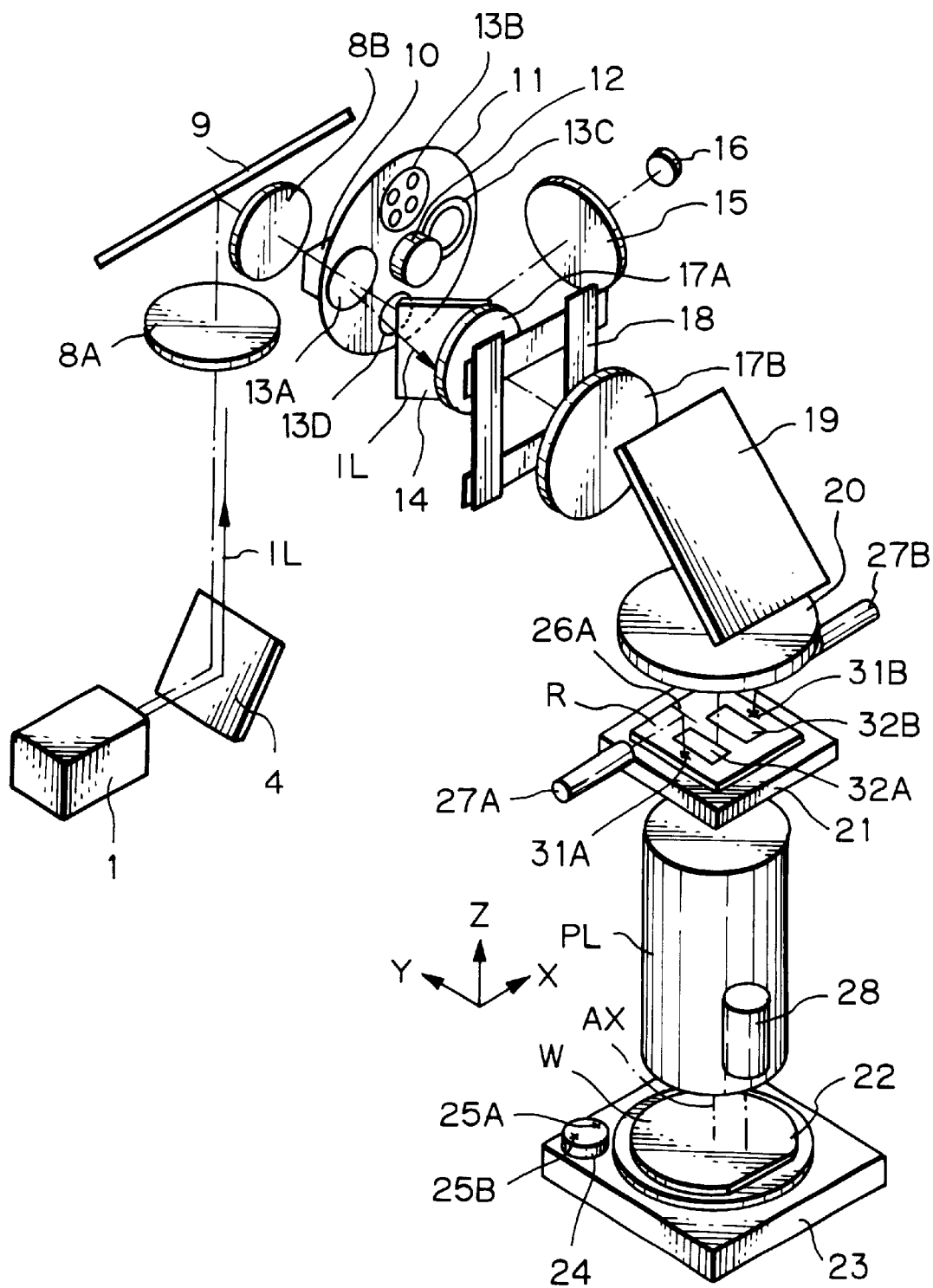
FIG. 2 is a perspective view schematically showing the arrangement of a projection exposure apparatus used in the embodiment of the present invention.

FIG. 2 shows a projection exposure apparatus used in this embodiment. Referring to FIG. 2, an exposure light source 1 is a KrF excimer laser light source which emits pulsed laser light of wavelength 248 nanometers as exposure light IL. The exposure light IL is reflected by an optical path-bending mirror 4. Thereafter, the exposure light IL passes via a first lens 8A, an optical path-bending mirror 9 and a second lens 8B and enters a fly's-eye lens 10. The first lens 8A and the second lens 8B constitute a beam shaping optical system. The beam shaping optical system shapes the sectional configuration of the exposure light IL in conformity to the entrance surface of the fly's-eye lens 10. It should be noted that other excimer laser light, e.g. ArF excimer laser light, or the i-line (wavelength: 365 nanometers) from a mercury-vapor lamp can also be used as exposure light.

An aperture stop plate 11 of an illumination system is rotatably disposed at the exit surface of the fly's-eye lens 10.

The aperture stop plate 11 has four different aperture stops 13A, 13B, 13C and 13D formed around its axis of rotation. The aperture stop 13A is a circular aperture stop for ordinary illumination. The aperture stop 13B consists essentially of a plurality of decentered small apertures so as to be used for modified illumination. The aperture stop 13C is an annular zone-shaped aperture stop for annular zone illumination. The aperture stop 13D is a small circular aperture stop for a small coherence factor (a value). The desired illumination system aperture stop can be placed at the exit surface of the fly's-eye lens 10 by driving the aperture stop plate 11 with a driving motor 12.

A part of exposure light IL passing through the aperture stop at the exit surface of the fly's-eye lens 10 is reflected by a beam splitter 14 and passes through a condenser lens 15 to enter an integrator sensor 16 which is formed from a photoelectric detector. A main control system (not shown) including a computer can indirectly monitor the illuminance (pulse energy) of exposure light IL at the surface of a wafer W and the integral of light exposure on the surface of the wafer W from the detected signal from the integrator sensor 16. Exposure light IL passing through the beam splitter 14 passes via a first relay lens 17A, a variable field stop (reticle blind) 18, a second relay lens 17B, an optical path-bending mirror 19 and a condenser lens 20 to illuminate a pattern surface of a reticle R. The plane where the variable field stop 18 is placed and the pattern surface of the reticle R are conjugate with each other. The aperture configuration of the variable field stop 18 defines an illumination area on the pattern surface of the reticle R. Under the application of exposure light IL, an image of a pattern in the illumination area on the reticle R is projected onto a photoresist-coated wafer W through a projection optical system PL at a predetermined projection magnification $\beta$ ($\beta$ is, for example, ¼ or ⅕).

Let us take a Z-axis in a direction parallel to an optical axis AX of the projection optical system PL, and X- and Y-axes in a plane perpendicular to the Z-axis so as to form an orthogonal coordinate system. The reticle R is held on a reticle stage 21 which effects positioning in the X and Y directions and also in the direction of rotation. The wafer W is held by a vacuum on a wafer holder 22. The wafer holder 22 is secured to the surface of a wafer stage 23. The wafer stage 23 corrects the position of the wafer W in the Z direction and the tilt angle thereof to bring the surface of the wafer W into focus to the image plane of the projection optical system PL. The wafer stage 23 also performs stepping and positioning of the wafer W in the X and Y directions. The position of the reticle stage 21 (reticle R) and the position of the wafer stage 23 (wafer W) are measured with high accuracy by respective laser interferometers (not shown). The operations of the reticle stage 21 and the wafer stage 23 are controlled by the main control system (not shown) on the basis of the result of the measurement.

During exposure, upon completion of the exposure for a certain shot area on the wafer W, the wafer stage 23 is stepped to move the subsequent shot area to the exposure field, and exposure is carried out for this shot area. This operation is repeated by the step-and-repeat method to effect exposure for each shot area on the wafer W. During the exposure process, the amount of light exposure for each shot area is controlled on the basis of the detected signal from the integrator sensor 16.

A fiducial mark member 24 is secured to the surface of the wafer stage 23 in the vicinity of the wafer holder 22. The fiducial mark member 24 is a glass substrate having fiducial marks 25A and 25B formed thereon. The fiducial marks 25A and 25B are formed, for example, in a cross shape from a chromium film or the like. An image processing type alignment sensor 28 (disclosed, for example, in U.S. Pat. No. 5,493,403) is installed on a side of the projection optical system PL to detect the position of a wafer mark attached to each shot area on the wafer W. The fiducial mark member 24 further has a fiducial mark (not shown) for the alignment sensor 28. The reticle R also has alignment marks 31A and 31B formed on the pattern surface thereof in a positional relationship obtained by changing the positional relationship between the fiducial marks 25A and 25B at the magnification of projection from the wafer to the reticle. Image processing type reticle alignment microscopes 27A and 27B are installed above the alignment marks 31A and 31B to effect alignment through mirrors 26A and so forth.

To effect alignment of the reticle R, for example, the fiducial marks 25A and 25B are illuminated from the bottom thereof by illuminating light of the same wavelength as that of exposure light in a state where the center between the fiducial marks 25A and 25B is set substantially in the center of the exposure field of the projection optical system PL. The images of the fiducial marks 25A and 25B are formed in the vicinities of the alignment marks 31A and 31B. The reticle alignment microscope 27A detects the amount of displacement of the alignment mark 31A relative to the image of the fiducial mark 25A. The reticle alignment microscope 27B detects the amount of displacement of the alignment mark 31B relative to the image of the fiducial mark 25B. The reticle stage 21 is positioned so as to correct the amounts of displacement, thereby effecting alignment of the reticle R relative to the wafer stage 23. At this time, the distance (base line quantity) from the detection center of the alignment sensor 28 to the center of the pattern image of the reticle R is calculated by observing the corresponding fiducial mark with the alignment sensor 28. To perform overlay exposure to the wafer W, the wafer stage 23 is driven on the basis of a position determined by correcting the result of the detection by the alignment sensor 28 by the base line quantity, thereby enabling the pattern image of the reticle R to be transferred onto each shot area on the wafer W with high overlay accuracy. It should be noted that one example of the measurement of the base line is disclosed, for example, in U.S. Pat. No. 5,243,195.

The following is a description of an example of an operation carried out to form a predetermined circuit pattern of a semiconductor device in each shot area on the wafer W by using the projection exposure apparatus according to this embodiment.

Figure 3A:
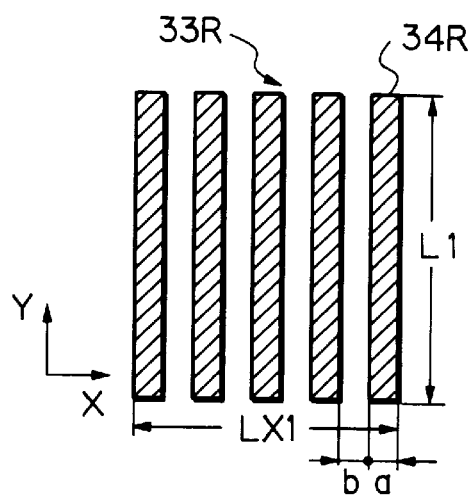
FIG. 3(a) is an enlarged plan view showing an example of a reticle pattern to be transferred.
Figure 3B:
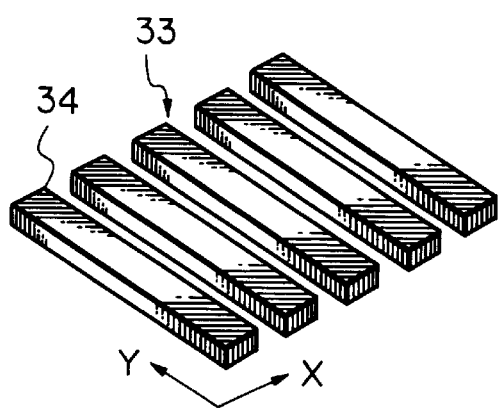
FIG. 3(b) is an enlarged perspective view showing an example of a circuit pattern to be formed.

FIG. 3(b) shows a circuit pattern to be formed in each shot area on the wafer in this embodiment. Referring to FIG. 3(b), a periodic circuit pattern 33 is formed on the wafer. The circuit pattern 33 has pattern elements 34 made of a metal film with a predetermined thickness. The pattern elements 34 are elongated in the Y direction and arrayed at a predetermined pitch in the X direction. The ratio (duty ratio) of the width in the X direction of each pattern element 34, which constitutes the circuit pattern 33, to the distance in the X direction between each pair of adjacent pattern elements 34 is 1:1. In this case, the pattern elements 34 have a length-to-width ratio which is not 1:1; the length in the Y direction of each pattern element 34 is longer than the width in the X direction. Let us assume that a reticle pattern 33R shown in FIG. 3(a) is an original-plate pattern obtained when the circuit pattern 33 is enlarged at the projection magnification of the projection optical system PL in FIG. 2 from the wafer to the reticle.

Figure 4A:
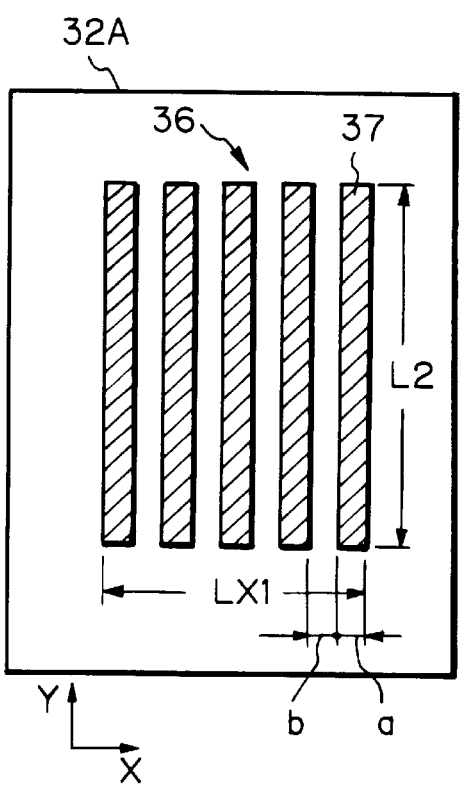
FIG. 4(a) is a diagram showing a first pattern which defines a configuration in the shorter dimension.
Figure 4B:
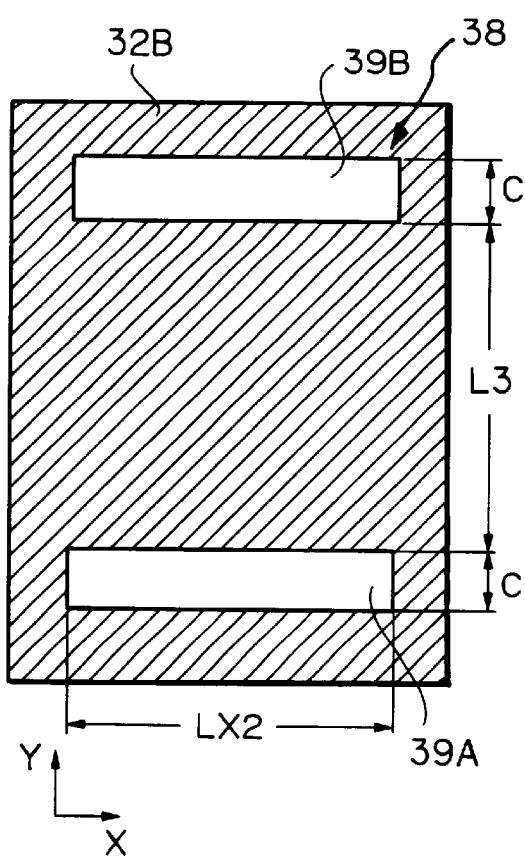
FIG. 4(b) is a diagram showing a second pattern which defines a configuration in the longer dimension.

Referring to FIG. 3(a), the reticle pattern 33R has five rectangular light-blocking pattern elements 34R in a light-transmitting area as a background. The light-blocking pattern elements 34R each have a width a in the X direction and a length L1 (L1>a) in the Y direction and are arrayed in the X direction at regular intervals b, i.e. at a pitch (a+b). The width LX1 in the X direction of the reticle pattern 33R is (5a+4b). In the following, let us express the size of each portion of the reticle pattern 33R by the size of an image thereof as projected onto the wafer. In this embodiment, the width a of each of the five light-blocking pattern elements 34R is 180 nanometers; the interval b is 180 nanometers; the width LX1 is 1620 nanometers; and the length L1 in the Y direction of the light-blocking pattern elements 34R is 1800 nanometers. In this case, each light-blocking pattern element 34R constituting the reticle pattern 33R has a length-to-width ratio which is not 1:1. That is, for the light-blocking pattern elements 34R, the X direction is the shorter dimension, and the Y direction is the longer dimension. In this embodiment, the reticle pattern 33R is split into a first pattern 36 which defines the configuration in the shorter dimension, as shown in FIG. 4(a), and a second pattern 38 which defines the configuration in the longer dimension, as shown in FIG. 4(b). As shown in FIG. 2, the reticle R is split into two pattern areas 32A and 32B in the X direction. The first pattern 36 is formed in the -X side pattern area 32A, and the second pattern 38 is formed in the +X side pattern area 32B.

Referring to FIG. 4(a), the first pattern 36 has five rectangular light-blocking pattern elements 37 formed in a light-transmitting area as a background. The light-blocking pattern elements 37 each have a width a in the X direction and a length L2 in the Y direction and are arrayed in the X direction at regular intervals b. That is, the light-blocking pattern elements 37 are equal to the light-blocking pattern elements 34R of the reticle pattern 33R in terms of the width a and interval b in the shorter dimension. The length L2 in the longer dimension of the light-blocking pattern elements 37 is 2000 nanometers, for which the following condition holds:

$$L2 > L1 \quad (1)$$

In FIG. 4(b), the second pattern 38 has two rectangular opening pattern elements 39A and 39B formed in a light-blocking area as a background. The opening pattern elements 39A and 39B each have a width LX2 (>LX1) in the X direction and a width c in the Y direction and are spaced apart from each other in the Y direction by a distance L3. In this case, the width LX2 of the opening pattern elements 39A and 39B is 2000 nanometers, and the width c is 200 nanometers. The distance L3 is 1800 nanometers. That is, in combination with Eq.(1), the following conditions hold:

$$L2 > L3 = L1 \quad (2)$$

$$L3 + 2c > L2 \quad (3)$$

In actual practice, the distance L3 may be set within the following range:

$$L2 > L3 \geq L1 \quad (4)$$

The width c in the Y direction of the opening pattern elements 39A and 39B of the second pattern 38 may be set so as to satisfy the following condition within the range defined by Eq.(3):

$$c \leq 5 \cdot a \quad (5)$$

Figure 1:
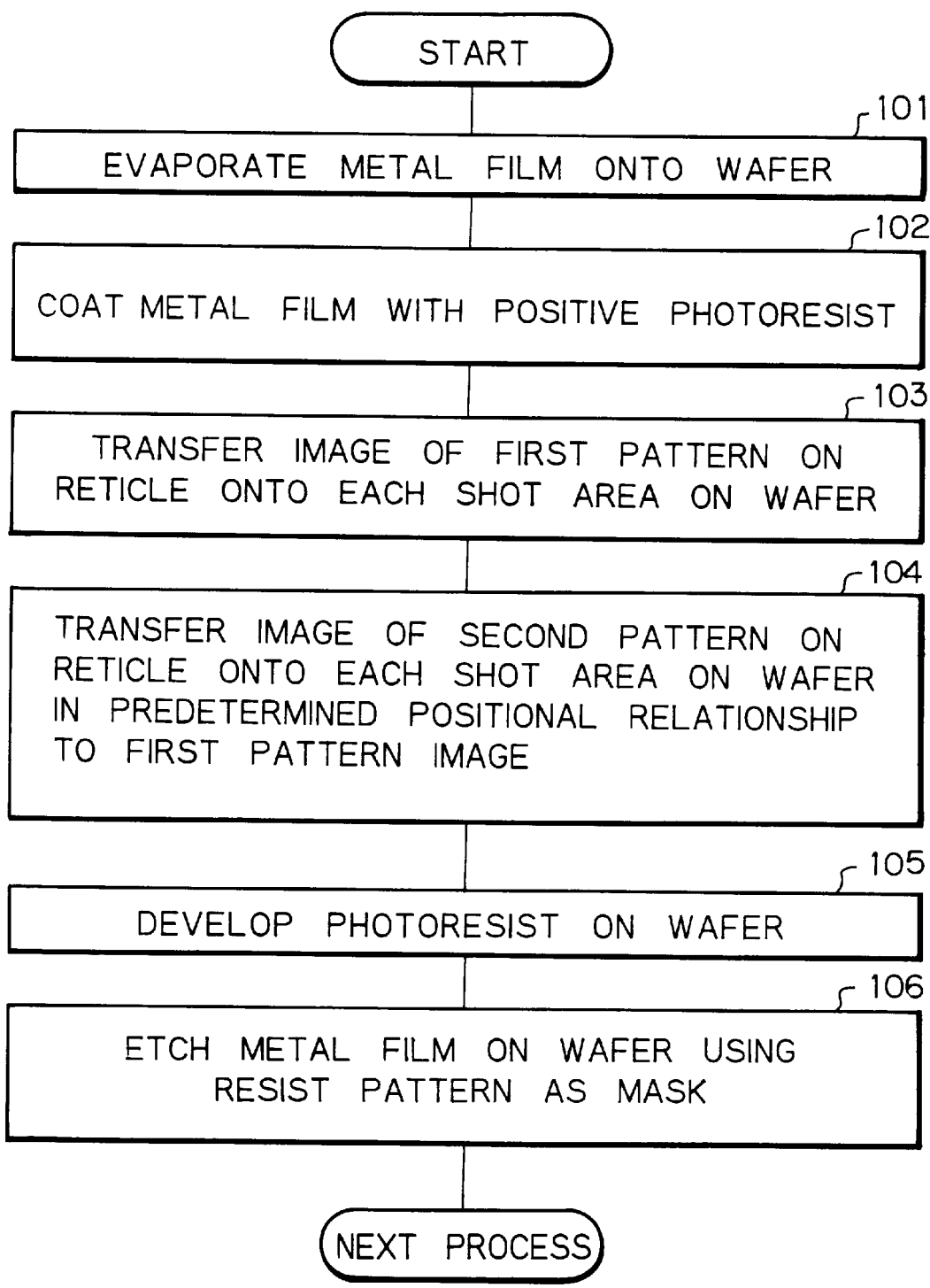
FIG. 1 is a flowchart showing a pattern forming process in an embodiment of the present invention.

Next, an example of an operation carried out to form a circuit pattern 33 by using the above-described first and second patterns 36 and 38 will be described with reference to the flowchart of FIG. 1. In this case, the reticle R in FIG. 2 has the first pattern 36 (FIG. 4(a)) and the second pattern 38 (FIG. 4(b)) formed in the pattern areas 32A and 32B, respectively.

At step 101 in FIG. 1, a metal film is evaporated onto a wafer to be exposed (hereinafter referred to as "wafer W"). At step 102, the metal film on the wafer W is coated with a positive photoresist. Thereafter, at step 103, the wafer W is placed on the wafer holder 22 of the projection exposure apparatus in FIG. 2. At this time, prealignment is performed on the basis of the outer dimensions, for example. Then, as has already been stated above, alignment of the pattern areas 32A and 32B of the reticle R relative to the wafer stage 23 is performed by using the fiducial mark member 24 and the reticle alignment microscopes 27A and 27B. Thereafter, to carry out overlay exposure, the position of a wafer mark attached to a predetermined shot area on the wafer W is detected through the alignment sensor 28, and the array coordinates of each shot area are calculated on the basis of the result of the detection.

After one pattern area 32A on the reticle R has been set in the illumination area by the variable field stop 18, the aperture stop 13C for annular zone illumination is set at the exit surface of the fly's-eye lens 10 by rotating the aperture stop plate 11. In this case, it is assumed that the numerical aperture NA of the projection optical system PL is 0.60, and that the outer diameter of the annular zone-shaped aperture stop 13C is 0.80 in terms of the a value, and the inner diameter of the aperture stop 13C is ⅔ of the outer diameter. Thereafter, the exposure light source 1 is driven to emit light for each shot area on the wafer W to transfer thereonto an image of the first pattern 36 in the pattern area 32A, which defines the configuration in the shorter dimension, while controlling the amount of light exposure on the basis of the detected signal from the integrator sensor 16. The correct exposure for this exposure process can be predetermined by test printing or the like.

At step 104, after the other pattern area 32B has been set in the illumination area by the variable field stop 18, the aperture stop 13A for ordinary illumination is set at the exit surface of the fly's-eye lens 10 by rotating the aperture stop plate 11. In this case, it is assumed that the numerical aperture NA of the projection optical system PL is 0.60, and the a value of the aperture stop 13A is 0.80. Thereafter, the exposure light source 1 is driven to emit light for each shot area on the wafer W to transfer thereonto an image of the second pattern 38 in the pattern area 32B, which defines the configuration in the longer dimension, while controlling the amount of light exposure on the basis of the detected signal from the integrator sensor 16. In this case, alignment of each shot area on the wafer W is performed such that the center of the image of the first pattern 36 and the center of the image of the second pattern 38 coincide with each other.

Thereafter, at step 105, the photoresist on the wafer W is developed. Thus, in each shot area on the wafer W, regions corresponding to the images of the light-blocking pattern elements 34R of the reticle pattern 33R in FIG. 3(a) are left in the form of projecting resist pattern elements. At step 106, the metal film on the wafer W is etched using the resist pattern as a mask. Thereafter, the resist pattern is removed. Consequently, a circuit pattern 33 as shown in FIG. 3(b) is formed in each shot area on the wafer W. Thereafter, the wafer W is moved to the subsequent process for forming a circuit pattern in the subsequent layer.

As a specific example, an exposure process was carried out by setting the amount of light exposure for transferring the image of the first pattern 36 at step 103 such that the width in the X direction of each projecting resist pattern element (the image of each light-blocking pattern element 37) left after the development would be a, i.e. 180 nanometers, and further setting the amount of light exposure for transferring the image of second pattern 38 at step 104 to the same value as in the exposure for the first pattern 36. As a result, the error of the length in the Y direction of the resist pattern after the development relative to the design value (L1) was not more than 50 nanometers.

In contrast, when exposure was carried out with an amount of light exposure set such that the width in the X direction of each resist pattern element after the development would be a (180 nanometers) by using the reticle pattern 33R itself, which is shown in FIG. 3(a), the error of the length in the Y direction of the resist pattern relative to the design value was 250 nanometers. In other words, with the exposure method according to this embodiment, the error of the length in the longer dimension of the resist pattern after the development is reduced to ⅕ or less. Thus, the length of each pattern element 34 of the finally formed circuit pattern 33 can be controlled with improved accuracy.

Although in the foregoing embodiment a periodic reticle pattern 33R as shown in FIG. 3(a) is split into the first pattern 36 and the second pattern 38 and exposure is carried out for each of the first and second patterns 36 and 38, it should be noted that the present invention is also applicable to a case where the pattern to be exposed is an isolated pattern. That is, in a case where the reticle pattern to be exposed is, for example, a single light-blocking pattern element 34R as shown in FIG. 3(a), exposure should be carried out by splitting the light-blocking pattern element 34R into a first light-blocking pattern element 37 which defines the shorter dimension as shown in FIG. 4(a) and a second pattern 38 which defines the longer dimension as shown in FIG. 4(b). In this case, the width in the X direction of the second pattern 38 may be shorter than in the foregoing embodiment.

Figure 5A:
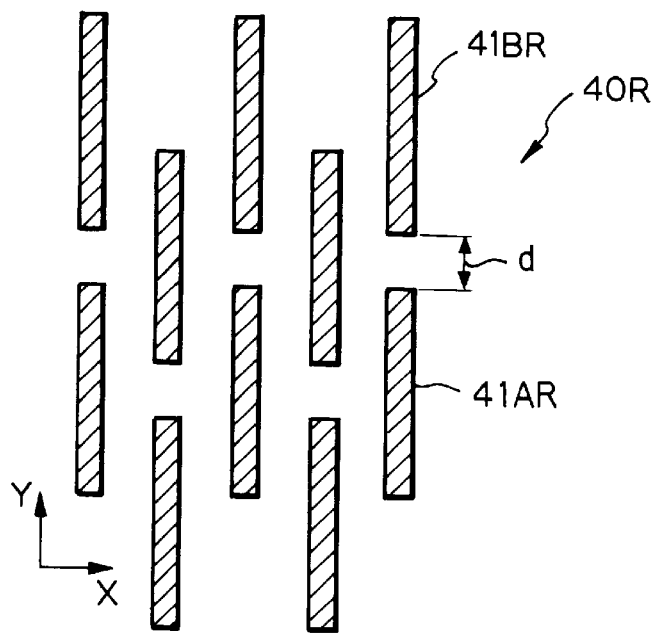
FIG. 5(a) is an enlarged plan view showing another example of a reticle pattern to be transferred.

The present invention is applicable not only to an exposure process using a reticle pattern which is periodic in only one direction, but also to an exposure process for transferring an image of a reticle pattern which is periodic in two mutually intersecting directions as shown in FIG. 5(a).

FIG. 5(a) shows a reticle pattern 40R which is periodic in both the X and Y directions. Referring to FIG. 5(a), the reticle pattern 40R has five rows of pattern elements arrayed in the X direction at a predetermined pitch. Each row has rectangular light-blocking pattern elements 41AR and 41BR which are elongated in the Y direction and arrayed in the Y direction at an interval d. The second and fourth rows of pattern elements are displaced in the Y direction by a half pitch relative to the other rows of pattern elements. The light-blocking pattern elements 41AR and 41BR each have a length-to-width ratio which is not 1:1. That is, the length in the Y direction is longer than the width in the X direction.

Figure 5B:
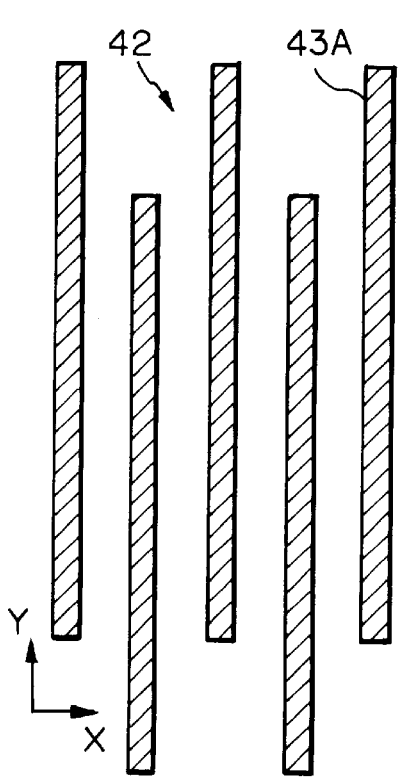
FIG. 5(b) is a diagram showing a first pattern which defines a configuration in the shorter dimension.
Figure 5C:
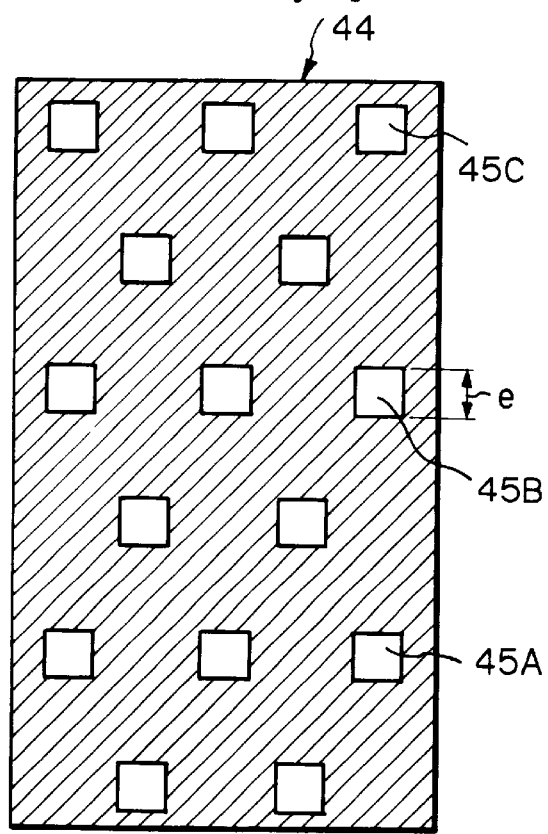
FIG. 5(c) is a diagram showing a second pattern which defines a configuration in the longer dimension.

To transfer the image of the reticle pattern 40R, the reticle pattern 40R is split into a first pattern 42 which defines the configuration in the shorter dimension as shown in FIG. 5(b), and a second pattern 44 which defines the configuration in the longer dimension as shown in FIG. 5(c). The first pattern 42 has light-blocking pattern elements 43A which are elongated in the Y direction and arrayed in the X direction at a predetermined pitch. The light-blocking pattern elements 43A each have the same width in the X direction as the light-blocking pattern elements 41AR and 41BR. The length in the Y direction of each light-blocking pattern element 43A is set longer than the overall length of the corresponding row of light-blocking pattern elements in the reticle pattern 40R. The second pattern 44 has opening pattern elements 45A, 45B and 45C formed in a light-blocking film as a background. The opening pattern elements 45A and 45C are disposed at respective positions corresponding to the longitudinal ends of the first row of light-blocking pattern elements 41AR and 41BR of the reticle pattern 40R. The opening pattern element 45B is disposed at a position corresponding to the border between the light-blocking pattern elements 41AR and 41BR. The opening pattern elements 45A, 45B and 45C each have a length e in the Y direction. Similarly, the same opening pattern elements are formed at respective positions corresponding to the ends and border in each of the other rows of light-blocking pattern elements of the reticle pattern 40R. The width in the X direction of each of the opening pattern elements 45A, 45B and 45C is wider than the width of the light-blocking pattern elements 41AR and BR. The length e in the Y direction of the opening pattern elements 45A, 45B and 45C is set equal to the distance d between the light-blocking pattern elements 41AR and 41BR.

In this case also, an image of the reticle pattern 40R in FIG. 5(a) which is reduced at a predetermined magnification can be transferred with high line-width control accuracy in both the X and Y directions by optimizing the exposure conditions for the first pattern 42 and the exposure conditions for the second pattern 44.

Although in the foregoing embodiment the first and second patterns 36 and 38 are formed in respective pattern areas on the same reticle, it should be noted that the first and second patterns 36 and 38 may be formed on different reticles, respectively. The present invention is applicable not only to an exposure process carried out by a projection exposure apparatus using a projection optical system PL which comprises a refracting system as in the foregoing embodiments, but also to an exposure process carried out by a projection exposure apparatus using a projection optical system which comprises a reflecting system using a mirror or a catadioptric (reflective refracting) optical system, or a step-and-scan type projection exposure apparatus (e.g. U.S. Pat. Nos. 5,194,893, 5,473,410 and 5,591,958).

To form a device pattern in each of a plurality of divided areas (shot areas) on a wafer, the first and second patterns 36 and 38 may be alternately transferred for each divided area. Alternatively, the arrangement may be such that the first pattern 36 is first transferred onto each of the plurality of divided areas, and thereafter, the second pattern 38 is transferred onto each of the divided areas over the first pattern. The latter method has an advantage over the former method in throughput because it needs to change the illumination conditions (to drive the aperture stop plate 11) only once in the exposure process for one wafer. To minimize the amount of movement of the wafer stage 23 to thereby improve the throughput furthermore, it is preferable in the latter method that the transfer of the second pattern 38 should be started with the last divided area in the sequence of transferring the first pattern 36. In other words, it is preferable that the exposure sequence of the divided areas on the wafer for the first pattern 36 and that for the second pattern 38 should be reverse to each other.

Illuminating light for exposure that is used in exposure apparatuses to which the present invention is applicable are not necessarily limited to emission lines (e.g. g-line or i-line) emitted from mercury-vapor lamps, KrF excimer laser light and ArF excimer laser light. It is also possible to use $F_2$ laser light (wavelength: 157 nanometers) or harmonics from a YAG laser.

The present invention is also applicable to a projection exposure apparatus using as illuminating light for exposure EUV (Extreme Ultra Violet) light having an oscillation spectrum in a wavelength region of from 5 to 15 nanometers (soft X-ray region), for example. It should be noted that the projection exposure apparatus using EUV light has a reduction projection optical system which defines the shape of an illumination area on a reflective mask as an arcuate slit-like shape. The reduction projection optical system consists essentially of a plurality of reflecting optical elements (mirrors). The reflective mask and a wafer are synchronously moved with a speed ratio corresponding to the magnification of the reduction projection optical system, thereby transferring a pattern formed on the reflective mask onto the wafer. It should be noted that the present invention is also applicable to a proximity type X-ray exposure apparatus using hard X-rays (wavelength: 1 nanometer, for example) as illuminating light for exposure.

The present invention is also applicable to an exposure process carried out by an exposure apparatus such as an electron beam exposure apparatus which transfers a mask pattern onto a substrate coated with an electron beam resist or the like by using a charged particle beam. Thus, the present invention is not necessarily limited to the above-described embodiments but may adopt various arrangements without departing from the gist of the present invention.

According to the exposure method of the present invention, a mask pattern is exposed by splitting it into a first pattern which controls the configuration in the shorter dimension and a second pattern which controls the configuration in the longer dimension. Therefore, an image of a pattern whose length and width are different from each other can be transferred onto a substrate by exposure with high dimensional control accuracy in both the shorter and longer dimensions.

The first and second patterns may be set such that the first pattern is wider than the mask pattern in the longer dimension of the mask pattern, and the second pattern has one or a plurality of opening pattern elements arrayed in the longer dimension of the mask pattern, and that if there are at least two opening pattern elements, the spacing therebetween is not shorter than the length of the mask pattern and is shorter than the length of the first pattern. In this case, it is possible to improve the control accuracy for the length in the longer dimension of the pattern image transferred.

In a case where a substrate to be exposed is coated with a positive photosensitive material, it is possible to gradually increase the dimensional accuracy of the pattern image transferred in two exposure operations. In such a case, the present invention is particularly effective.

According to the device producing method of the present invention, a pattern whose length and width are different from each other can be formed on a substrate with high dimensional control accuracy by using the exposure method according to the present invention.

What is claimed is:

1. An exposure method in which an image of a device pattern whose length and width are different from each other is transferred onto a predetermined substrate under application of predetermined exposure light or a predetermined charged particle beam, said method comprising the steps of:

generating a first pattern which limits a configuration in a shorter dimension of said device pattern, and a second pattern which limits a configuration in a longer dimension of said device pattern and has a different configuration from said first pattern;

projecting an image of one of said first pattern and said second pattern onto said substrate, on which a positive photoresist is applied under a first exposure condition to transfer said image onto said photoresist; and projecting an image of the other of said first pattern and second pattern onto said substrate over a portion of the image of the one of said first pattern and said second pattern formed on said photoresist under a second exposure condition different from said first exposure condition to transfer said image onto said photoresist, said portion of the image limiting the configuration of said device pattern.

2. The exposure method according to claim 1, wherein said first pattern is wider than said device pattern in the longer dimension of said device pattern, and said second pattern has at least one opening pattern element disposed at an end in the longer dimension of said device pattern, wherein if said second pattern has at least two opening pattern elements, a distance between respective outer sides of said opening pattern elements is not shorter than the length of said device pattern, and a distance between respective inner sides of said opening pattern elements is shorter than the length of said first pattern.

3. The exposure method according to claim 1, wherein said first exposure condition is a first illumination condition and said second exposure condition is a second illumination condition which is different from said first illumination condition.

4. The exposure method according to claim 3, wherein one of said first and second illumination conditions is an abnormal illumination condition under which distribution in the periphery of a center portion of amount of light of an illumination light on a predetermined plane is higher than that in the center portion, said predetermined plane being substantially in optical Fourier transform relation to said pattern in an illumination optical system and wherein the other of said first and second illumination conditions is a normal illumination condition under which distribution in the center portion of amount of light of said illumination light on said predetermined plane is higher than that in the periphery of the center portion.

5. The exposure method according to claim 4, wherein under said abnormal illumination condition, said distribution of amount of light on the predetermined plane is an annular zone shape.

6. The exposure method according to claim 4, wherein said first pattern is a pattern which has periodicity in a predetermined direction and is projected onto said substrate under said abnormal illumination condition.

7. The exposure method according to claim 1, wherein said first pattern and said second pattern are formed in different areas from each other, said different areas being on a same mask.

8. The exposure method according to claim 1, wherein said first pattern is formed on a first mask and said second pattern is formed on a second mask which is different from said first mask.

9. The device manufacturing method comprising a step of transferring the device pattern onto said substrate by use of an exposure method according to claim 1.

10. An exposure method in which an image of a device pattern whose length L1 and width a (a length of L1 is longer than a length of a) are different from each other is transferred onto a predetermined substrate under illumination of predetermined exposure light or a predetermined charged particle beam, said method comprising the steps of:

generating first pattern which limits a configuration in a shorter dimension of said device pattern, said first pattern having a light-blocking area which has a longer dimension L2 (a length of L2 is longer than the length of L1) of said device pattern;

generating a second pattern which limits a configuration in the longer dimension of said device pattern, said second pattern having a plurality of light-non-blocking areas, said light-non-blocking areas having a length in the direction of said shorter dimension of said device pattern, said length being longer than said width a, said light-non-blocking areas being apart from each other by a dimension L3 (a length of L3 is equal or longer than the length of L1, and the length of L3 is smaller than the length of L2) in the direction of said longer dimension of said device pattern;

projecting an image of one of said first pattern and said second pattern onto said substrate on which a positive photoresist is applied, to transfer said image onto said photoresist; and projecting an image of the other of said first pattern and said second pattern onto said substrate over a portion of the image of the one of said first pattern and said second pattern formed on said photoresist to transfer said image onto said photoresist, said portion of the image limiting the configuration of said device pattern.

11. The exposure method according to claim 10, wherein each of said plurality of light-non-blocking areas on said second pattern has a longer dimension c and wherein the following expressing is satisfied:

$$L3+2\times c>L2$$

wherein 2×c means twice c.

12. The exposure method according to claim 10, wherein a first exposure condition under which said first pattern is transferred onto said substrate is different from a second exposure condition under which said second pattern is transferred onto said substrate.

13. The exposure method according to claim 10, wherein said exposure condition includes a light illumination condition.

14. The exposure method according to claim 10, wherein said first pattern is a periodic pattern, said periodic pattern having said light-blocking areas which are periodically arranged in the direction of said shorter dimension of said device pattern and wherein said first pattern is transferred onto said substrate under oblique light illumination condition.

15. The exposure method according to claim 10, wherein the amount of light exposure which is applied when said second pattern is transferred onto said photoresist is the same as that which is applied when said first pattern is transferred onto said photoresist.

16. The exposure method according to claim 10, wherein said first pattern and said second pattern are formed in different areas from each other, said different areas being on a same mask.

17. The exposure method according to claim 10, wherein said first pattern is formed on a first mask and said second pattern is formed on a second mask which is different from said first mask.

18. The device manufacturing method comprising a step of transferring the device pattern onto said substrate by use of an exposure method according to claim 10.

19. An exposure method in which an image of a device pattern which has a plurality of line patterns is transferred onto a predetermined substrate under illumination of predetermined exposure light or a predetermined charged particle beam, length Y1 and width X1 (a length of Y1 is longer than a length of X1) of each of said line patterns being different from each other, said plurality of line patterns being apart from each other by interval Y2 in the direction of a longer dimension of said line patterns, said method comprising the steps of:

generating a first pattern which limits a configuration in a shorter dimension of said line pattern, said first pattern having a light-blocking area, said light-blocking area having a length which covers a length between opposite ends in the direction of the longer dimension of said plurality of line patterns;

generating a second pattern which limits a configuration in the longer dimension of said device pattern, said second pattern having a plurality of light-non-blocking areas, said light-non-blocking areas having a longer dimension and a shorter dimension and being apart from each other by interval Y1 in the direction of the longer dimension of said line pattern, each of said light-non-blocking areas having a length which is the same as that of said interval Y2 in the direction of the longer dimension;

projecting an image of one of said first pattern and said second pattern onto said substrate on which a positive photoresist is applied, to transfer said image onto said photoresist; and projecting an image of the other of said first pattern and said second pattern onto said substrate over a portion of the image of one of said first pattern and said second pattern formed on said photoresist to transfer said image onto said photoresist, said portion of the image limiting the configuration of said device pattern.

20. The exposure method according to claim 19, wherein a length in a same direction of said shorter dimension of said light-non-blocking areas on said second pattern is longer than said width X1 of said line pattern.

21. The exposure method according to claim 19, wherein said device pattern includes said line patterns, said line patterns being periodically arranged in two crossing directions, wherein said first pattern is a periodic pattern which has said light-blocking areas periodically arranged in a predetermined direction and wherein said second pattern is a periodic pattern which has said light-non-blocking areas periodically arranged in said two crossing directions.

22. The exposure method according to claim 19, wherein said first pattern and said second pattern are transferred onto said substrate under exposure conditions according to said first and second patterns, respectively.

23. The exposure method according to claim 19, wherein said exposure condition includes a light illumination condition.

24. The exposure method according to claim 19, wherein said first pattern and said second pattern are formed in different areas from each other, said different areas being on a same mask.

25. The exposure method according to claim 19, wherein said first pattern is formed on a first mask and said second pattern is formed on a second mask which is different from said first mask.

26. The device manufacturing method comprising a step of transferring the device pattern onto said substrate by use of an exposure method according to claim 19.

* * * * *